(12) United States Patent
Agan et al.

(10) Patent No.: US 7,403,043 B2
(45) Date of Patent: *Jul. 22, 2008

(54) MAGNETIC TRANSISTOR CIRCUIT REPRESENTING THE DATA '1' AND '0' OF THE BINARY SYSTEM

(75) Inventors: Tom Allen Agan, St. Paul, MN (US); James Chyi Lai, Saint Paul, MN (US)

(73) Assignee: Northern Lights Semiconductor Corp., St. Paul, MN (US)

( * ) Notice: Subject to any disclaimer, the term of this patent is extended or adjusted under 35 U.S.C. 154(b) by 15 days.

This patent is subject to a terminal disclaimer.

(21) Appl. No.: 11/549,272

(22) Filed: Oct. 13, 2006

(65) Prior Publication Data
US 2007/0097588 A1 May 3, 2007

Related U.S. Application Data

(60) Provisional application No. 60/727,346, filed on Oct. 17, 2005, provisional application No. 60/727,346, filed on Oct. 17, 2005.

(51) Int. Cl.
H03K 19/20 (2006.01)

(52) U.S. Cl. .............................. 326/104; 326/37; 326/52
(58) Field of Classification Search .................... 326/37, 326/104, 136
See application file for complete search history.

(56) References Cited

U.S. PATENT DOCUMENTS

2004/0213042 A1* 10/2004 Johnson ........................ 365/158
2006/0164124 A1* 7/2006 Koch et al. .................... 326/104

* cited by examiner

*Primary Examiner*—Anh Q Tran
(74) *Attorney, Agent, or Firm*—Thomas, Kayden, Horstemeyer & Risley

(57) ABSTRACT

A magnetic transistor circuit representing the data '1' and '0' of the binary system comprises a routing line and a magnetic transistor unit. The routing line has a current going through with a first current direction or a second current direction, wherein the first current direction and the second current direction are opposite to represent the data '1' and the data '0' respectively. The magnetic transistor unit couples to the routing line at an output end to control the direction of the current going through the routing line.

9 Claims, 3 Drawing Sheets

MAGNETIC TRANSISTOR CIRCUIT REPRESENTING THE DATA '1' AND '0' OF THE BINARY SYSTEM

CROSS-REFERENCE TO RELATED APPLICATION

This application claims the priority benefit of provisional application Ser. No. 60/727,346, filed on Oct. 17, 2005, the full disclosure of which is incorporated herein by reference.

BACKGROUND

1. Field of Invention

The present invention relates to a transistor circuit representing the data '1' and '0' of the binary system. More particularly, the present invention relates to a magnetic transistor circuit representing the data '1' and '0' of the binary system.

2. Description of Related Art

The Giant Magnetoresistance Effect (GMR) is a quantum mechanical effect observed in structures with alternating thin magnetic and thin nonmagnetic sections. The GMR effect shows a significant change in electrical resistance from the zero-field high resistance state to the high-field low resistance state according to an applied external field.

Therefore, the GMR effect can be used to design the magnetic transistor. Thus, magnetic transistors can further be used to integrate a magnetic transistor circuit without the expensive process and equipment. The magnetic transistor circuit can be designed and manufactured with short programming time and high density.

For the foregoing reasons, we can use the characteristics of the magnetic transistor to create a magnetic transistor circuit to represent the data '1' and '0' of the binary system.

SUMMARY

It is therefore an aspect of the present invention to provide a magnetic transistor circuit to represent the data '1' and '0' of the binary system.

According to one embodiment of the present invention, the magnetic transistor circuit representing the data '1' and '0' of the binary system comprises a routing line and a magnetic transistor unit. The routing line has a current going through with a first current direction or a second current direction, wherein the first current direction and the second current direction are opposite to represent the data '1' and the data '0' respectively. The magnetic transistor unit couples the routing line at an output end to control the direction of the current going through the routing line.

It is to be understood that both the foregoing general description and the following detailed description are by examples, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
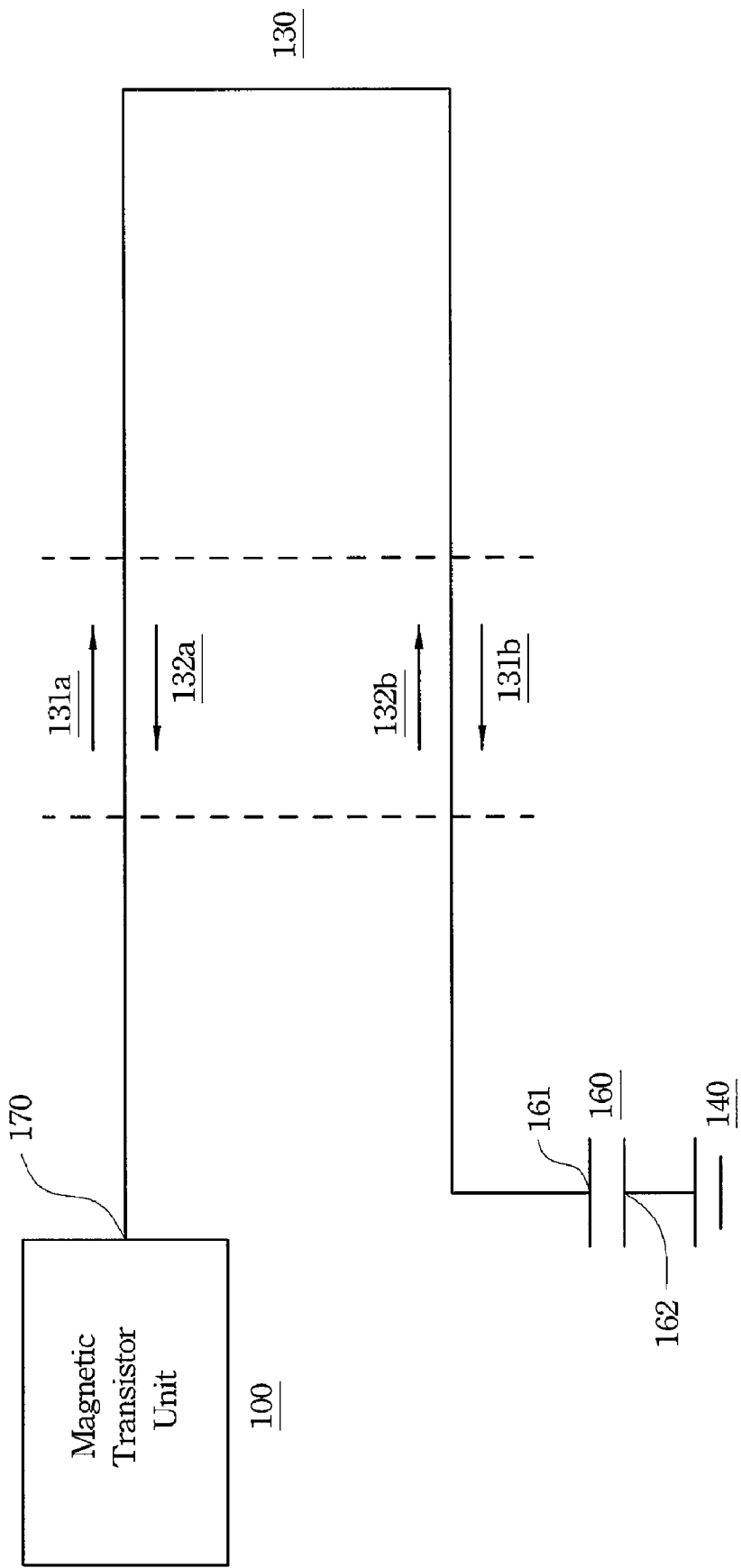
FIG. 1 is a magnetic transistor circuit representing the data '1' and '0' of the binary system according to one embodiment of this invention.

Reference will now be made in detail to the present preferred embodiments of the invention, examples of which are illustrated in the accompanying drawings. Wherever possible, the same reference numbers are used in the drawings and the description to refer to the same or like parts.

All figures are drawn for ease of explanation of the basic teachings of the present invention only; the extensions of the figures with respect to number, position, relationship, and dimensions of the parts to form the embodiment will be explained or will be within the skill of the art after the following description has been read and understood. Further, the exact dimensions and dimensional proportions to conform to specific force, weight, strength, and similar requirements will likewise be within the skill of the art after the following description has been read and understood.

FIG. 1 is a magnetic transistor circuit representing the data '1' and '0' of the binary system according to the embodiment of this invention. The magnetic transistor circuit representing the data '1' and '0' of the binary system comprises a routing line 130 and a magnetic transistor unit 100. The routing line has a current going through by a direction of a first current direction 131a and a second current direction 132a, wherein the first current direction 131a and the second current direction 132a are opposite to represent the data '1' and the data '0' respectively. The magnetic transistor unit 100 couples the routing line 130 at an output end 170 to control the direction of the current going through the routing line 130. The routing line 130 here can be any kind of materials with conductivity, such as the metal line in the ordinary integrated circuit.

The magnetic transistor circuit representing the data '1' and '0' of the binary system further comprises a capacitor 160 coupled between the routing line 130 and a low voltage end 140. Thus, the capacitor 160 couples to the routing line 130 at the end 161, and couples to the low voltage end 140 at the end 162.

Since the magnetic transistor unit 100 just needs only a current pulse to control the current direction, once the current pulse has gone through the routing line 130, the current direction is set and the data '1' or '0' of the binary system is defined, even if the power is removed. A current pulse can be created by having a capacitor at the far end of the routing line 130. This allows the voltage on the routing line 130 is still the same as in standard CMOS. A high voltage to charge the capacitor 160 is a logic high (data '1' of the binary system), a low voltage charge on the capacitor is a logic low (data '0' of the binary system). Therefore, the magnetic transistor circuit is operable with standard CMOS circuit.

The symbols '→' and '←' are just arranged to respectively represent the first current direction 131a and the second current direction 132a, not arranged to restrict the current directions. Therefore, the first current direction can be from the magnetic transistor unit 100 to the capacitor 160, and the second current direction can be from the capacitor 160 to the magnetic transistor unit 100. On the contrary, the second current direction can be from the magnetic transistor unit 100 to the capacitor 160, and the first current direction can be from capacitor 160 to the magnetic transistor unit 100.

Otherwise, the first current direction 131a and the second current direction 132a can be opposite to respectively represent the data '0' and the data '1' by routing the routing line 130 in the opposite direction. When we route the routing line 130 in the opposite direction, we can get the current directions 131b and 132b. The current directions 131b is opposite to the first current direction 131a, and the current directions 132b is opposite to the second current direction 132a. Thus, we can get the different data by routing the routing line 130 in the opposite direction. For example, if we define the first current direction 131a(→) to be the data '1' of the binary system, we can get the data '0' of the binary system from the current direction 131b(←) in the opposite direction of the routing line 130.

Figure 2:
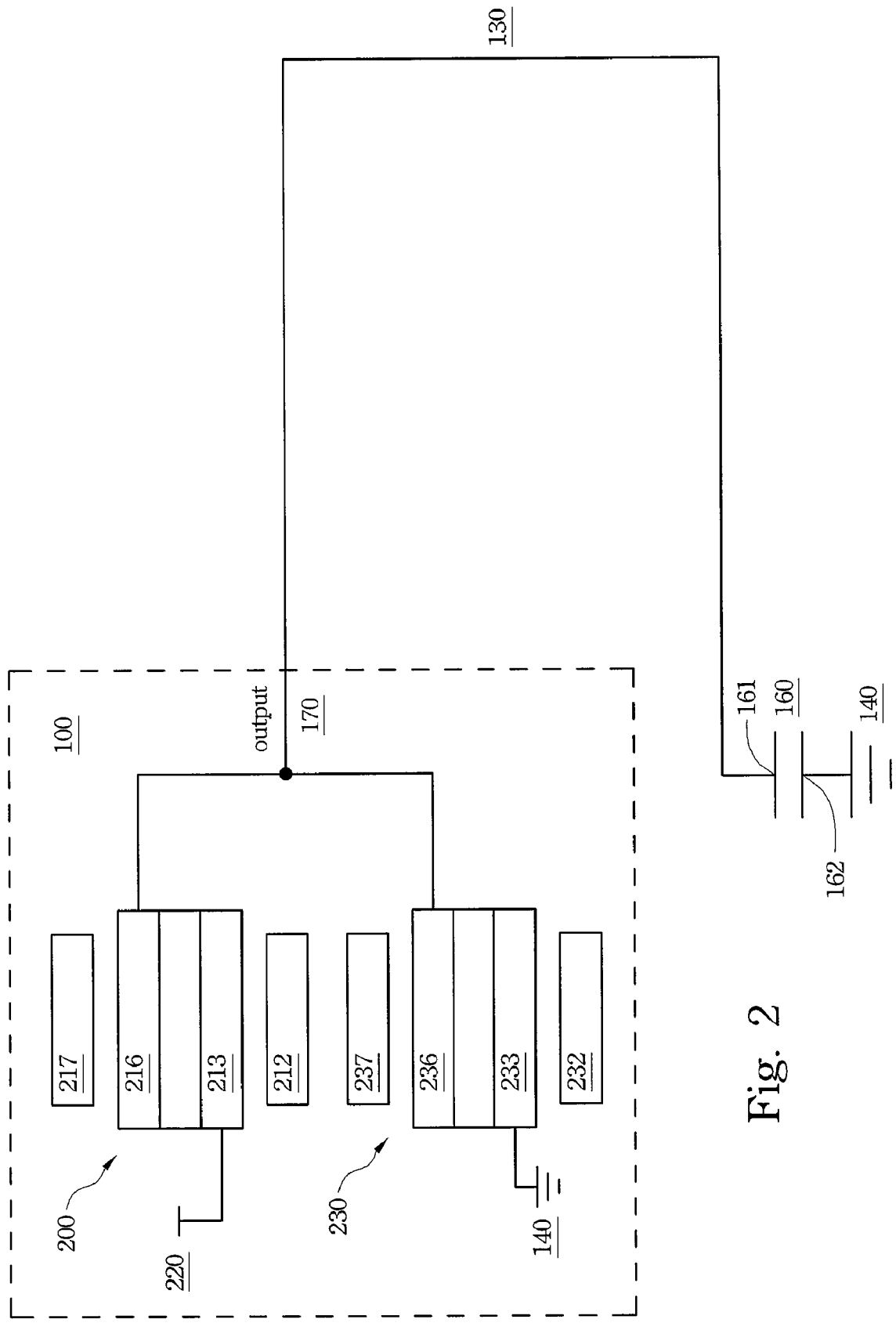
FIG. 2 is a magnetic transistor circuit representing the data '1' and '0' of the binary system according to another embodiment of this invention.

FIG. 2 is a magnetic transistor circuit representing the data '1' and '0' of the binary system according to another embodiment of this invention. FIG. 2 shows one kind of the magnetic transistor unit 100 of FIG. 1. The magnetic transistor unit 100 comprises at least one first magnetic transistor 200 and a second magnetic transistor 230. The magnetic transistor unit 100 can have only the first magnetic transistor 200 or only the second magnetic transistor 230 individually. These two magnetic transistors are shown together for an easier explanation.

The first magnetic transistor 200 has a first magnetic section 213 and a second magnetic section 216, wherein the first magnetic section 213 couples to a high voltage end 220, and the second magnetic section 216 couples to the output end 170. The second magnetic transistor 230 has a third magnetic section 233 and a fourth magnetic section 236, wherein the third magnetic section 233 couples to the low voltage end 140, and the fourth magnetic section 236 couples to the second magnetic section 216 and the output end 170.

The magnetic transistor circuit further comprises a plurality of metal devices 212, 217, 232 and 237 respectively disposed around the magnetic sections 213, 216, 233 and 236. The metal devices 212, 217, 232 and 237 are arranged to respectively control dipoles of the magnetic sections 213, 216, 233 and 236. For example, the first magnetic transistor 200 has metal devices 212 and 217 respectively disposed around the magnetic sections 213 and 216. The metal device 212 is arranged to control the dipole of the magnetic section 213, and the metal device 217 is arranged to control the dipole of the magnetic section 216.

By the description above, the designer can use the metal devices to control the dipoles of the magnetic sections. The designer can further use the dipoles of these two magnetic sections of one magnetic transistor to control the conductivity between these two magnetic sections.

For example, when dipoles of the first magnetic section 213 and the second magnetic section 216 are the same, the first magnetic section 213 and the second magnetic section 216 are conductive, when dipoles of the first magnetic section 213 and the second magnetic section 216 are different, the first magnetic section 213 and the second magnetic section 216 are not conductive.

When dipoles of the third magnetic section 233 and the fourth magnetic section 236 are the same, the third magnetic section 233 and the fourth magnetic section 236 are conductive, when dipoles of the third magnetic section 233 and the fourth magnetic section 236 are different, the third magnetic section 233 and the fourth magnetic section 236 are not conductive.

Figure 3:
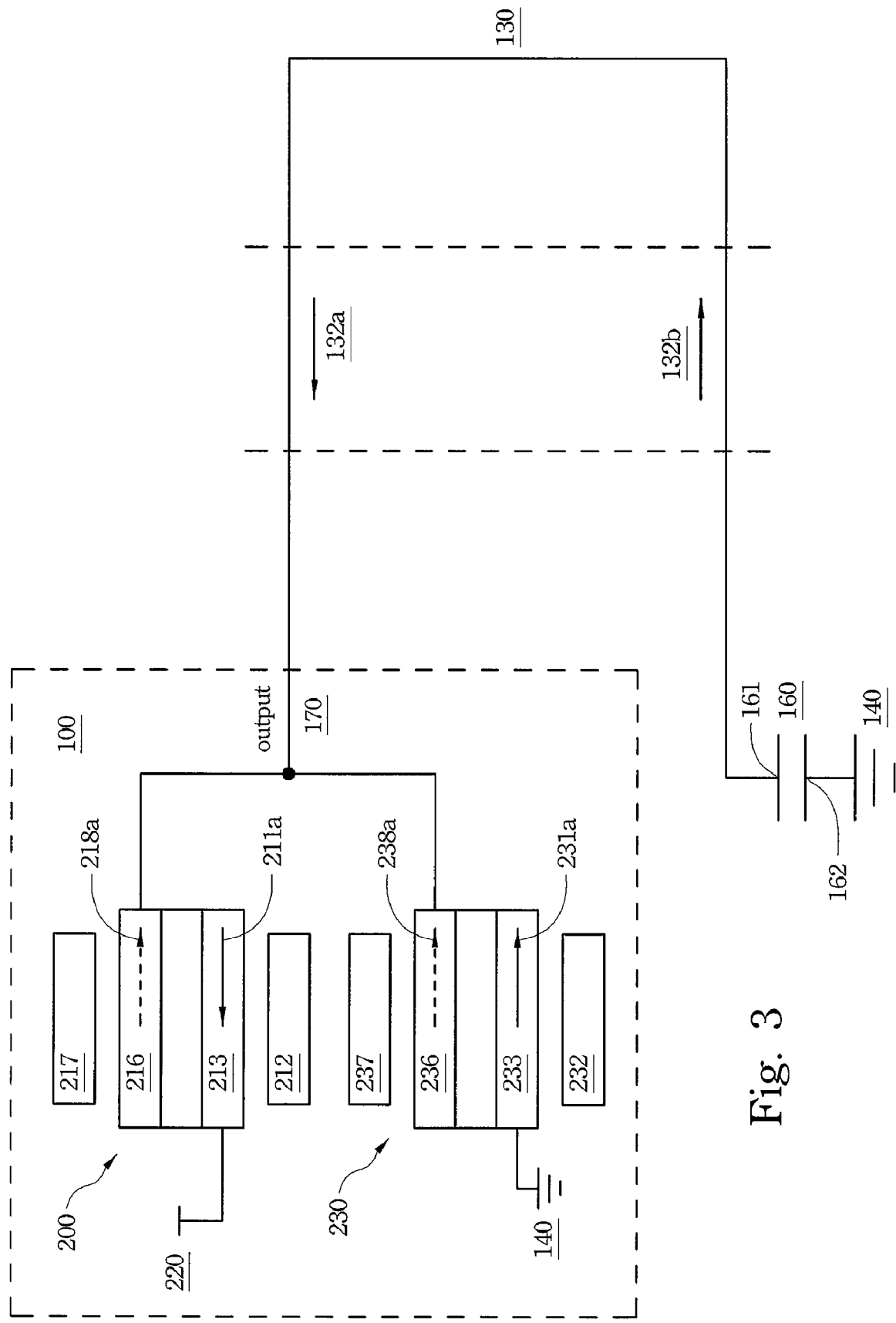
FIG. 3 is a magnetic transistor circuit representing the data '0' of the binary system according to one embodiment of this invention.

FIG. 3 is a magnetic transistor circuit representing the data '0' of the binary system according to one embodiment of this invention. The dipoles 218a and 238a of the second and fourth magnetic sections 216 and 236 are the first dipole that represents data '1' of the binary system to control the output data, and dipoles 211a and 231a of the first and third magnetic sections 213 and 233 are the second dipole and the first dipole respectively. The combination of the dipoles 211a, 218a, 231a and 238a makes the transistor 200 not conductive, and the transistor 230 conductive, and generates a current of the current direction 132a on the routing line 130.

Therefore, the current direction 132a(←) from the capacitor 160 to the magnetic transistor unit 100 on the routing line 130 represents the data '0' of the binary system. If we define the dipoles 218a and 238a of the first dipole (→) to be the data '1' as an input signal, the magnetic transistor circuit outputs the data '0' (by the current direction 132a) to operate the inverter logic function.

Otherwise, we can get different logic function by the current direction 132b(→) in the opposite direction of the routing line 130. If we define the dipoles 218a and 238a of the first dipole (→) to be the data '1' as an input signal, the magnetic transistor circuit outputs the data '1' (by the current direction 132b) to operate the buffer function.

In order to corporate with the ordinary integrated circuits of semiconductor, a voltage of the low voltage end 140 is about 0 volt, and a voltage of the high voltage end 220 is about 2.5 volt, 3.3 volt or 5 volt.

The symbols '→' and '←' here are just arranged to respectively represent the dipoles of the magnetic sections, not arranged to restrict the dipole directions. In the magnetic transistor circuit, each magnetic transistor has a conductive section between two magnetic sections. The conductivity of the conductive section can be controlled by the dipoles of these two magnetic sections. Therefore, the magnetic transistor circuit representing the data '1' and '0' of the binary system can be implemented by the description above.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A magnetic transistor circuit representing the data '1' and '0' of the binary system, comprising:
   a routing line with a current going through in a first current direction or a second current direction, wherein the first current direction and the second current direction are opposite to represent the data '1' and the data '0' respectively; and
   a magnetic transistor unit coupled to the routing line at an output end to control the direction of the current going through the routing line.

2. The magnetic transistor circuit representing the data '1' and '0' of the binary system of claim 1, further comprising a capacitor coupled between the routing line and a low voltage end.

3. The magnetic transistor circuit representing the data '1' and '0' of the binary system of claim 1, wherein the first current direction is from the magnetic transistor unit to the capacitor, and the second current direction is from the capacitor to the magnetic transistor unit.

4. The magnetic transistor circuit representing the data '1' and '0' of the binary system of claim 1, wherein the second current direction is from the magnetic transistor unit to the capacitor, and the first current direction is from the capacitor to the magnetic transistor unit.

5. The magnetic transistor circuit representing the data '1' and '0' of the binary system of claim 1, wherein the first current direction and the second current direction are opposite to respectively represent the data '0' and the data '1' by routing the routing line in the opposite direction.

6. The magnetic transistor circuit representing the data '1' and '0' of the binary system of claim 1, wherein the magnetic transistor unit comprises at least one first magnetic transistor having a first magnetic section and a second magnetic section coupled to a high voltage end and the output end respectively.

7. The magnetic transistor circuit representing the data '1' and '0' of the binary system of claim 1, wherein the magnetic transistor unit comprises at least one second magnetic transistor having a third magnetic section and a fourth magnetic section coupled to the output end and the low voltage end respectively.

8. The magnetic transistor circuit representing the data '1' and '0' of the binary system of claim 1, wherein a voltage of the low voltage end is about 0 volt.

9. The magnetic transistor circuit representing the data '1' and '0' of the binary system of claim 1, wherein a voltage of the high voltage end is about 2.5 volt, 3.3 volt or 5 volt.

* * * * *